(12) United States Patent
Dang et al.

(10) Patent No.: US 8,679,280 B2
(45) Date of Patent: Mar. 25, 2014

(54) LASER ABLATION OF ADHESIVE FOR INTEGRATED CIRCUIT FABRICATION

(75) Inventors: Bing Dang, Chappaqua, NY (US); Matthew Farinelli, Bronx, NY (US); John Knickerbocker, Yorktown Heights, NY (US); Aparna Prabhakar, North White Plains, NY (US); Robert E. Trzcinski, Rhinebeck, NY (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 435 days.

(21) Appl. No.: 12/788,839

(22) Filed: May 27, 2010

(65) Prior Publication Data

US 2011/0290413 A1 Dec. 1, 2011

(51) Int. Cl.
*B32B 38/10* (2006.01)
(52) U.S. Cl.
USPC .......... 156/247; 156/712; 156/753; 156/930; 438/976
(58) Field of Classification Search
USPC ................. 156/712, 753, 930, 247; 438/976
See application file for complete search history.

(56) References Cited

U.S. PATENT DOCUMENTS

| 5,056,296 | A * | 10/1991 | Ross et al. ...................... 53/478 |
| 6,211,041 | B1 * | 4/2001 | Ogura ............................ 438/458 |
| 6,383,833 | B1 * | 5/2002 | Silverbrook ................... 438/51 |
| 6,762,074 | B1 * | 7/2004 | Draney et al. ................. 438/106 |
| 2009/0032920 | A1 * | 2/2009 | Buchwalter et al. .......... 257/676 |
| 2009/0221217 | A1 | 9/2009 | Gajaria et al. |
| 2009/0261062 | A1 * | 10/2009 | Kim ................................ 216/24 |
| 2009/0311849 | A1 | 12/2009 | Andry et al. |
| 2010/0038127 | A1 | 2/2010 | Brist et al. |

OTHER PUBLICATIONS

Andry et al., Method of Separating Integrated Circuit Chips Fabricated on a Wafer, Filed Jun. 17, 2008, U.S. Appl. No. 12/140,492, IBM Corporation.

* cited by examiner

*Primary Examiner* — Mark A Osele
(74) *Attorney, Agent, or Firm* — Cantor Colburn LLP; Louis Percello (57) ABSTRACT

A method for releasing a handler from a wafer, the wafer comprising an integrated circuit (IC), includes attaching the handler to the wafer using an adhesive comprising a thermoset polymer, the handler comprising a material that is transparent in a wavelength range of about 193 nanometers (nm) to about 400 nm; ablating the adhesive through the handler using a laser, wherein a wavelength of the laser is selected based on the transparency of the handler material; and separating the handler from the wafer.

19 Claims, 9 Drawing Sheets

FIG. 9

LASER ABLATION OF ADHESIVE FOR INTEGRATED CIRCUIT FABRICATION

CROSS-REFERENCE TO RELATED APPLICATION

This application is related to Ser. Nos. 12/788,832 and 12/788,843, each assigned to International Business Machines Corporation (IBM) and filed on the same day as the instant application, all of which are herein incorporated by reference in their entirety.

FIELD

This disclosure relates generally to the field of integrated circuit fabrication.

DESCRIPTION OF RELATED ART

Multiple integrated circuit (IC) products, which may be referred to as chips or dies, may be formed on a larger semiconductor substrate, referred to as a wafer. The IC fabrication process may comprise fabrication of multiple complementary metal-oxide-semiconductor (CMOS) devices on the wafer. If the wafer is relatively thin, an adhesive may be used to attach the wafer to a rigid handler, so that the handler may provide mechanical support for the wafer during the CMOS fabrication processes. However, the CMOS fabrication process may include chemical processing and/or high temperature processing, which may reach temperatures up to 400° C., which may cause the adhesive to break down.

The wafer may be released from the handler after CMOS fabrication is completed. Some methods of handler release include use of a temperature-sensitive adhesive or a chemically dissolvable adhesive. However, a temperature-sensitive adhesive may only adhere the handler to the chip at temperatures under about 300° C. or lower. A chemically dissolvable adhesive may also only be appropriate for relatively low-temperature processing, and may require use of a specialized handler material to allow the release chemicals to diffuse through the handler in order to dissolve the adhesive. Wax sliding is another release method, but it is also limited to relatively low temperature processing, and may require a special sliding mechanism.

SUMMARY

In one aspect, a method for releasing a handler from a wafer, the wafer comprising an integrated circuit (IC), includes attaching the handler to the wafer using an adhesive comprising a thermoset polymer, the handler comprising a material that is transparent in a wavelength range of about 193 nanometers (nm) to about 400 nm; ablating the adhesive through the handler using a laser, wherein a wavelength of the laser is selected based on the transparency of the handler material; and separating the handler from the wafer.

In one aspect, a system for releasing a handler from a wafer, the wafer comprising an IC, includes a handler attached to a wafer using an adhesive comprising a thermoset polymer, the handler comprising a material that is transparent in a wavelength range of about 193 nanometers (nm) to about 400 nm; and a laser, the laser configured to ablate the adhesive through the handler, wherein a wavelength of the laser is selected based on the transparency of the handler material.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of systems and methods for laser ablation of adhesive for IC fabrication are provided, with exemplary embodiments being discussed below in detail. Appropriate selection of a handler material, an adhesive, and a laser having a specified wavelength allows for attachment of a handler to a CMOS wafer using the adhesive, and subsequent release of the handler from the wafer using laser ablation without contamination of or damage to the wafer. The adhesive may comprise a polymer, including but not limited to a thermoset polymer and/or a polyimide-based polymer, that may withstand temperatures up to about 400° C. and any chemical process that may occur during the fabrication process. The release process may be relatively fast, allowing good throughput for the overall IC fabrication process.

Figure 1:
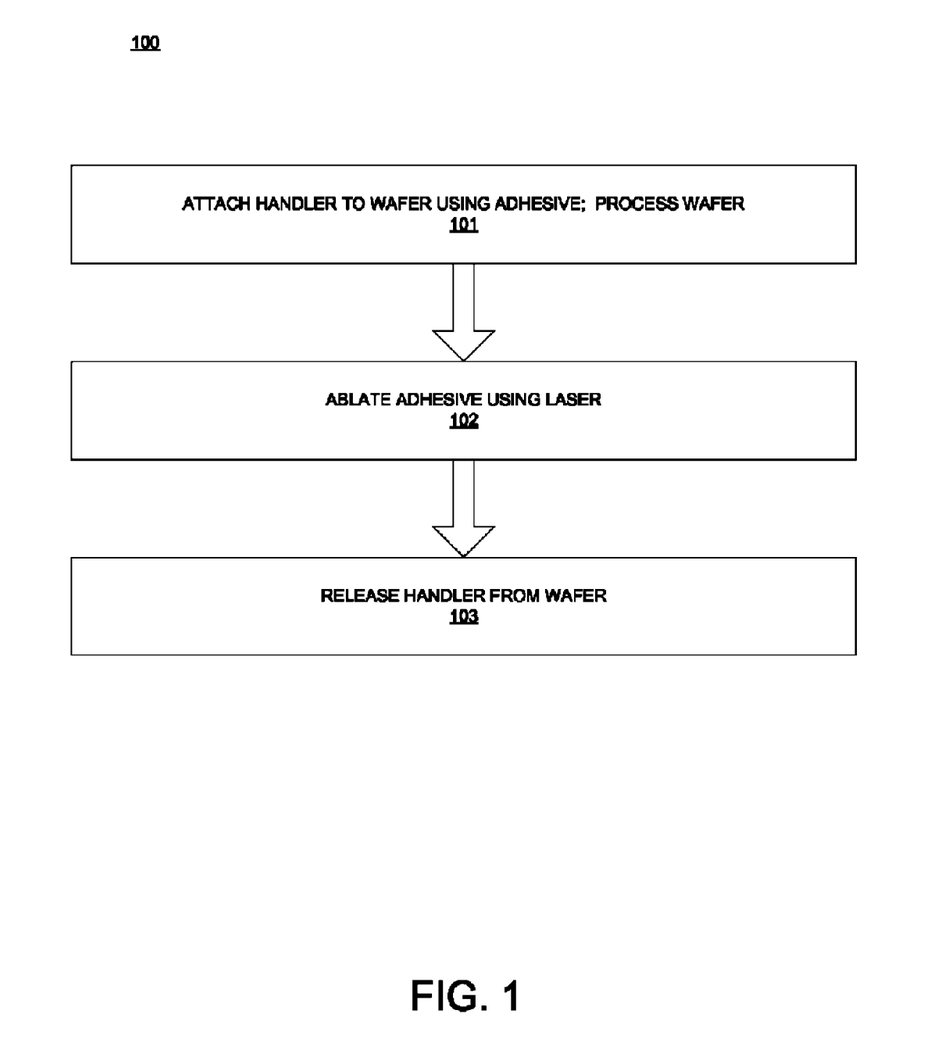
FIG. 1 illustrates an embodiment of a method for attachment and release of a handler to a wafer using laser ablation.
Figure 2:
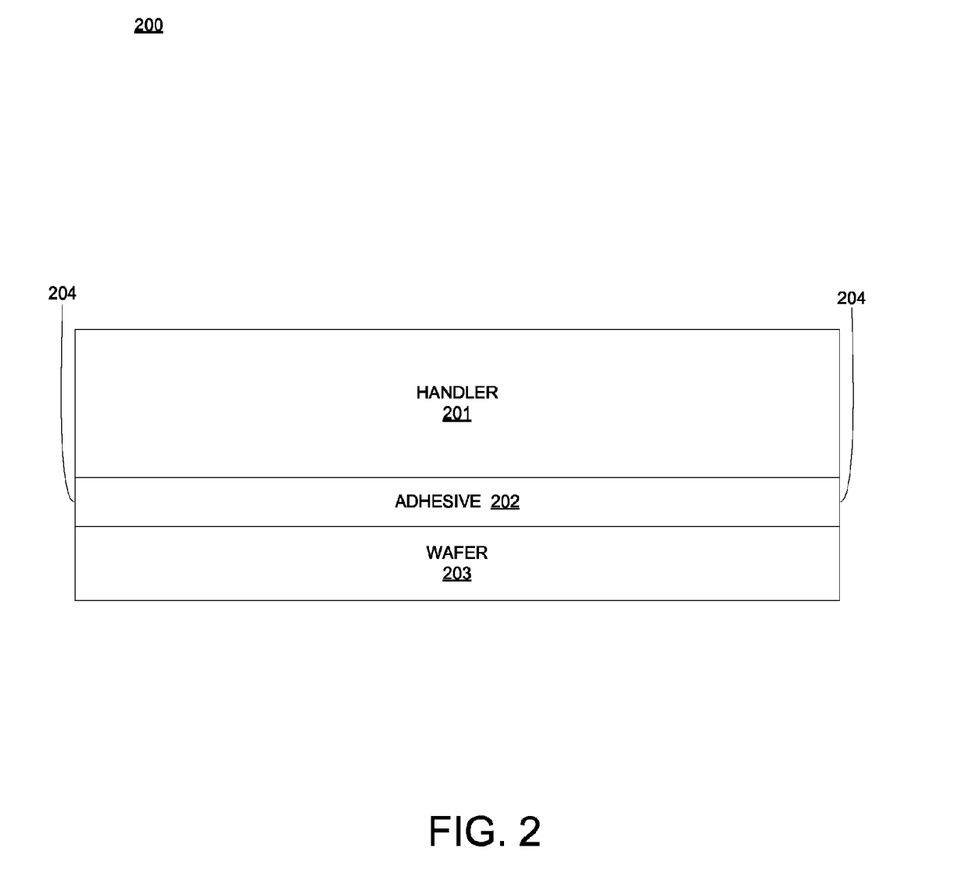
FIG. 2 illustrates an embodiment of a handler attached to a wafer using an adhesive.

FIG. 1 illustrates an embodiment of a method for attachment and release of a handler to a wafer using laser ablation. FIG. 1 is discussed with reference to FIGS. 2-9. In block 101, a handler 201 is attached to a wafer 203 using an adhesive 202, as shown in FIG. 2. The wafer 203 may comprise a thinned substrate, and may be between about 700 and 800 microns (μm) thick in some embodiments. The adhesive 202 may comprise a polymer, including but not limited to a thermoset polymer and/or a polyimide-based polymer, and may withstand high-temperature processing at over 280° C. in some embodiments, and in the range of 350° C. to 400° C. in some preferred embodiments.

After attachment of handler 201, processing, which may include CMOS fabrication processing, may be performed on wafer 203. The processed wafer 203 may comprise any appropriate CMOS devices, including silicon-based 3D or 4D IC chips, and may comprise electrical contacts and vias in some embodiments. The wafer 203 may comprise a thin film solar cell, a solar cell comprising a copper-indium-gallanide-selenium (CIGS) based thin film, a silicon solar cell, or a glass substrate based solar cell.

Handler 201 provides mechanical support to wafer 203 during CMOS processing. Handler 201 may comprise a relatively rigid material that is transparent in the range of about 193 nanometers (nm) to about 400 nm in some embodiments, and in some preferred embodiments in the range of about 248 nm to about 351 nm, including but not limited to quartz, glass, diamond, or sapphire. Handler 201 may be selected such that the coefficient of thermal expansion (CTE) of handler 201 is closely matched to the CTE of the material comprising wafer 203. Handler 201 may comprise electrical vias with connections that mate to any electrical contacts on wafer 203, allowing device 200 comprising handler 201 to be used in a test apparatus before release of handler 201 in some embodiments. Handler 201 may further comprise one or more additional layers of optical energy absorbing material located at the interface between adhesive 202 and handler 201, including but not limited to one or more layers of thin sputtered metal, or a layer of an additional polymer material.

The adhesive 202 may be thicker at the edge 204 of the device 200 than at the middle, which may optionally require special processing of the adhesive at the edge 204 of device 200 before laser ablation (discussed below with respect to block 102). In some embodiments, a chemical may be applied to the edge 204 to disintegrate the adhesive 202 located at the edge 204 of the device 200. In some embodiments, a focused ion beam or a high-energy electron beam may be applied to edge 204 to remove adhesive 202 located at the edge 204. In some embodiments the device 200 may be exposed to a vacuum or atmospheric pressure plasma environment whereby plasma disintegrates adhesive 202 located around the edge 204 of device 200. In some embodiments, the device 200 may be exposed to a super-critical solvent environment containing chemicals selected to degrade the adhesive 202, allowing for penetration of the solvents around the edge 204 of device 200.

In block 102, as shown in FIGS. 3-8, the adhesive 202 is ablated by a laser, as illustrated by lasers 301, 401, 501, 601, 701, and 801 of FIGS. 3-8. Energy from the laser passes through handler 201 and is absorbed by adhesive 202, causing the adhesive 202 to carbonize or vaporize, allowing release of handler 201 from wafer 203. The laser may comprise ultraviolet (UV) light having a wavelength between about 193 nm to about 400 nm in some embodiments, and between about 248 nm to 351 nm in some preferred embodiments. In embodiments in which handler 201 comprises quartz, the laser may have a wavelength of about 193 nm. The laser may be applied as a flood exposure to the surface of handler 201, or may be a focused beam having, for example, a line or square shape. The laser may be perpendicular to the surface of handler 201, or may be applied at an angle to reduce edge diffraction of the laser energy in handler 201. The laser may also be pulsed along the surface of handler 201 in order to avoid damage to wafer 203 while ablating adhesive 202. The pulse duration and pulse repetition rate of the laser may be varied as appropriate. Ablation may be performed at room temperature in some embodiments, or in other embodiments, the device 200 may be heated (up to about 400° C. in some embodiments) during ablation in order to promote the release of handler 201. Depending on the laser wavelength and the handler material, the transmission of the energy from the laser through handler 201 may be greater than 80%, and the light absorption depth in the adhesive 202 may be less than 1 μm.

Figure 3:
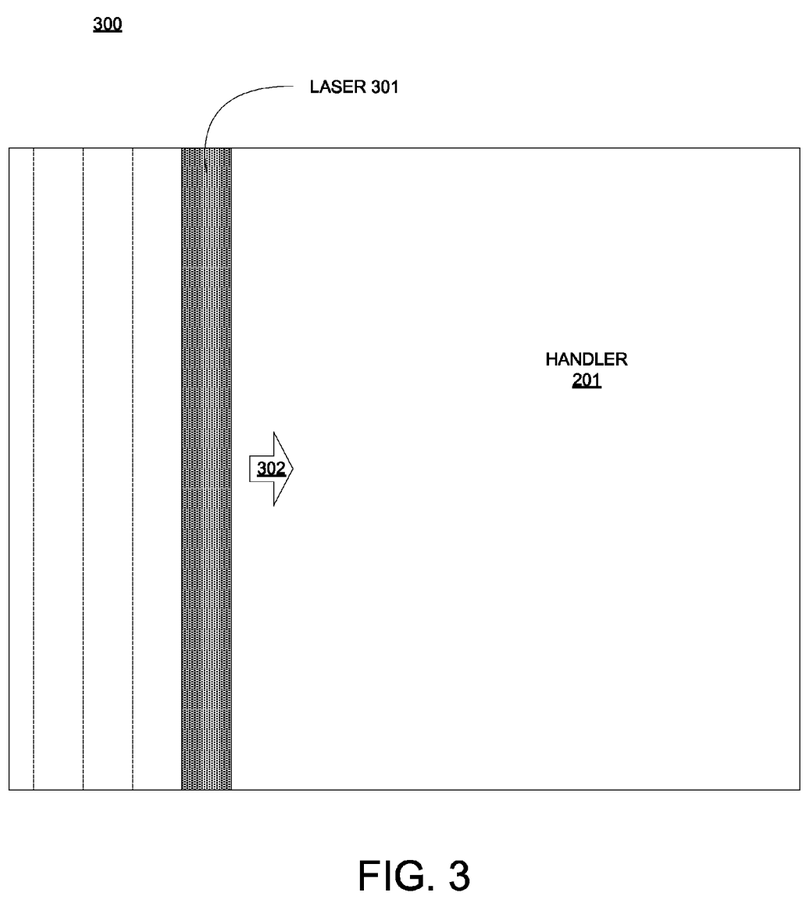
FIG. 3 illustrates an embodiment of the device of FIG. 2 during laser ablation.
Figure 4:
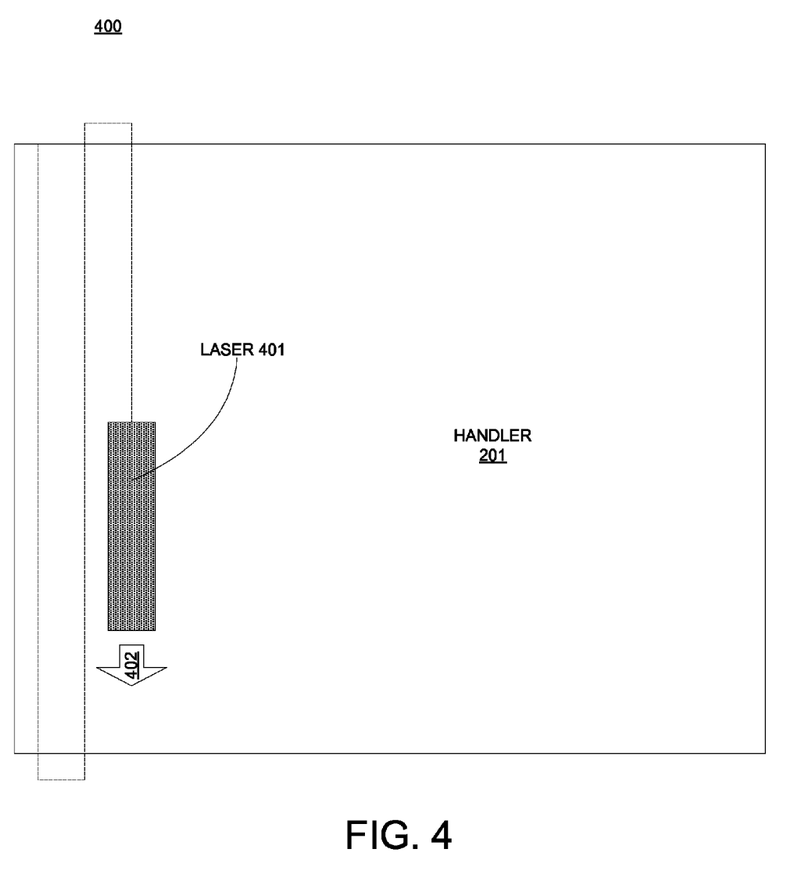
FIG. 4 illustrates an embodiment of the device of FIG. 2 during laser ablation.

FIGS. 3-8 illustrate various embodiments of laser ablation as performed in block 102. FIG. 3 illustrates a top view of a focused line laser 301 ablating adhesive 202 through handler 201. Focused line laser 301 may be pulsed across handler 201 in the direction indicated by arrow 302 to cover the entire surface of handler 201. FIG. 4 illustrates an embodiment of a top view of a square beam laser 401 ablating adhesive 202 through handler 201. Square beam laser 401 may be pulsed across handler 201 in the direction indicated by arrow 402 to eventually cover the entire surface of handler 201. The pulse duration and pulse repetition rate of lasers 301 and 401 may be varied as appropriate. FIGS. 3-4 are shown for illustrative purposes only; the laser used to ablate adhesive 202 in block 201 may be any appropriate shape.

Figure 5:
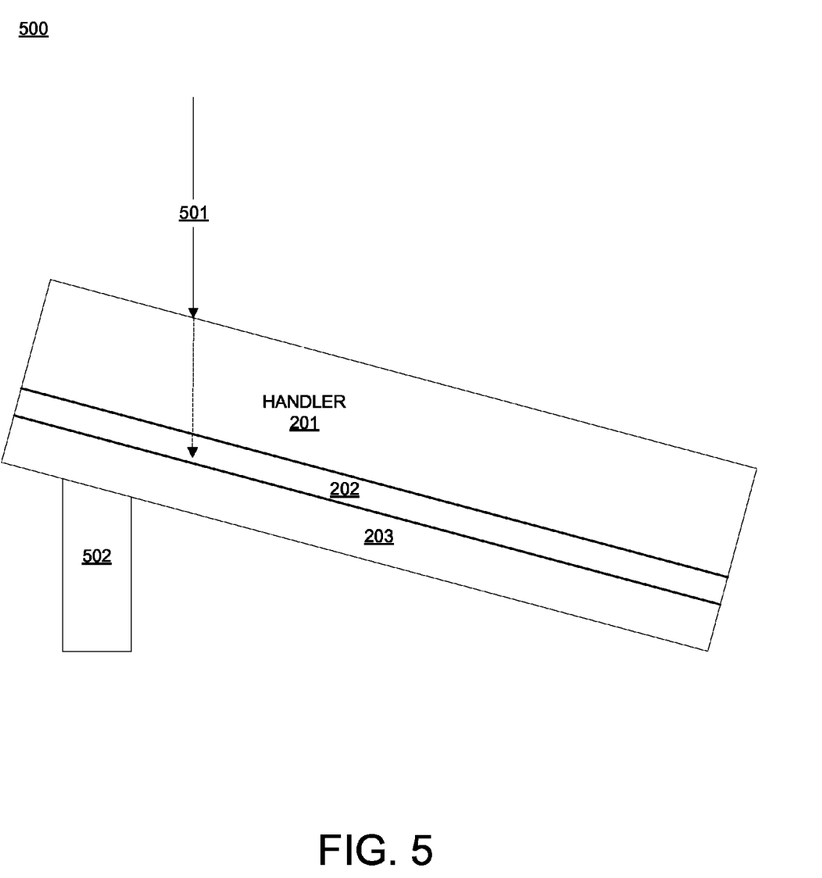
FIG. 5 illustrates an embodiment of the device of FIG. 2 during laser ablation.
Figure 6:
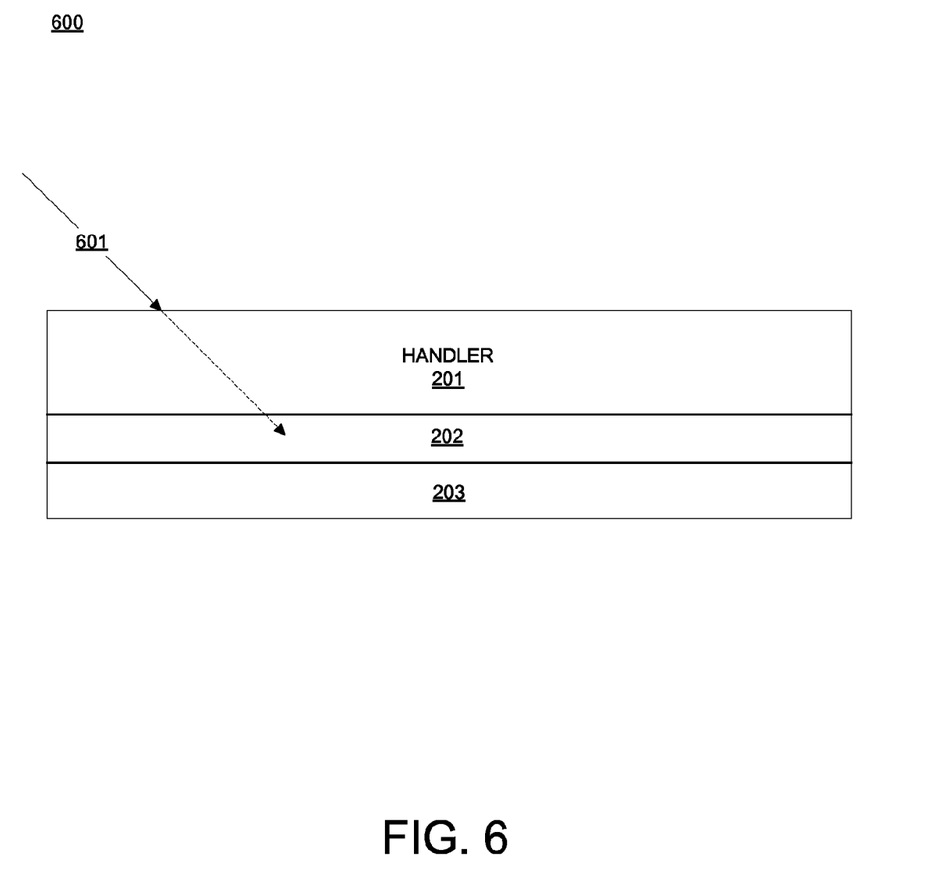
FIG. 6 illustrates an embodiment of the device of FIG. 2 during laser ablation.
Figure 7:
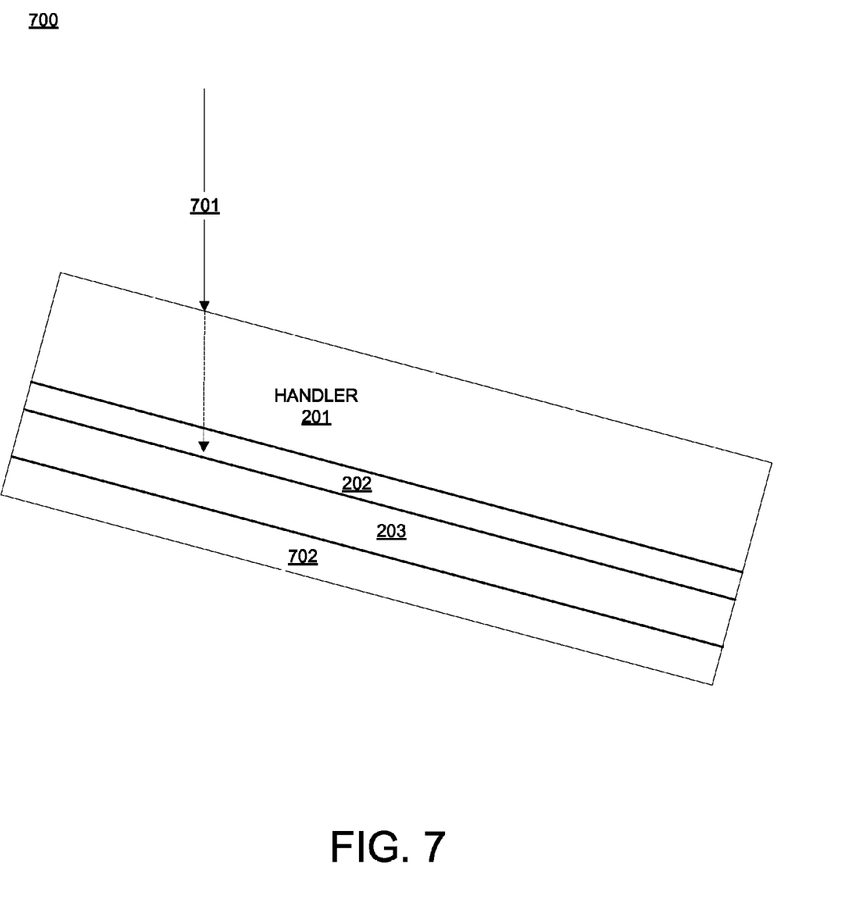
FIG. 7 illustrates an embodiment of the device of FIG. 2 during laser ablation.
Figure 8:
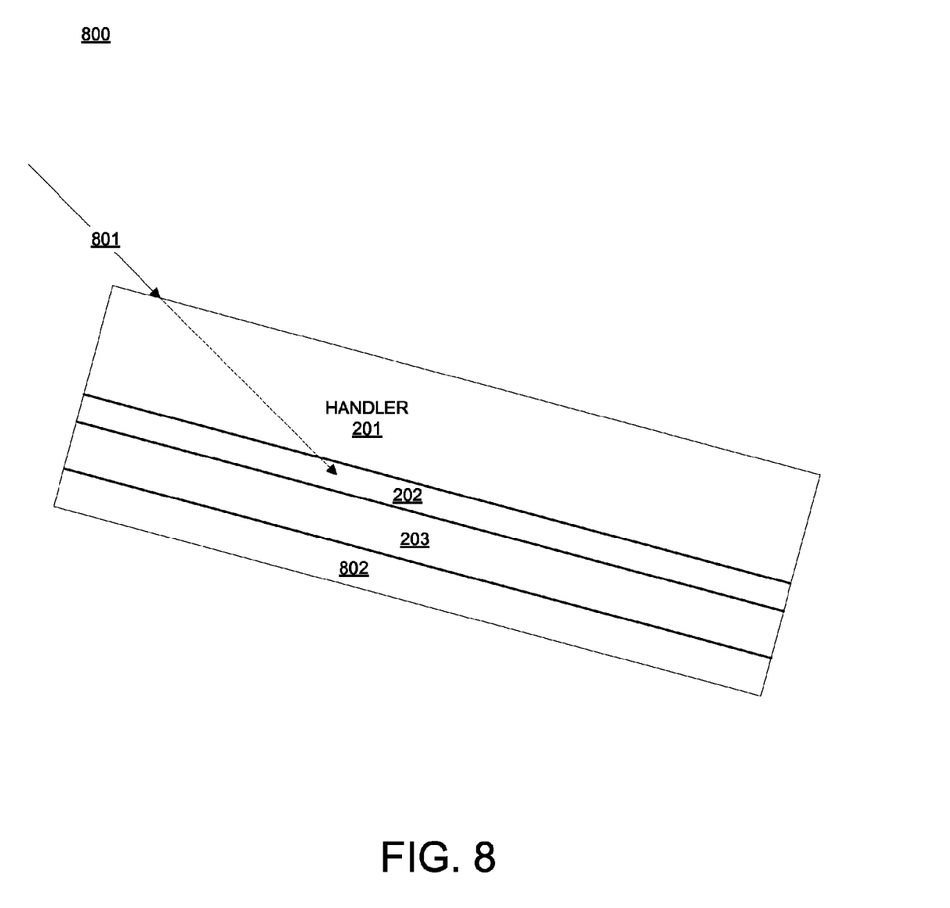
FIG. 8 illustrates an embodiment of the device of FIG. 2 during laser ablation.

Edge diffraction of the laser energy may occur near the edge 204 of device 200; therefore, the laser may be angled with respect to handler 201, as shown in FIGS. 5-8, to reduce edge diffraction issues in the handler 201 during ablation. FIG. 5 illustrates a cross section of an embodiment of a system for laser ablation in which hander 201, adhesive 202, and wafer 203 are supported at an angle by support 502 during ablation by vertical laser 501. FIG. 6 illustrates a cross section of an embodiment of a system for laser ablation in which laser 601 is angled with respect to handler 201, and hander 201, adhesive 202, and wafer 203 are flat. FIG. 7 illustrates a cross section of an embodiment of a system for laser ablation in which hander 201, adhesive 202, and wafer 203 are supported at an angle on a rotary stage 702 during ablation by vertical laser 701. Rotary stage 702 may move as needed in any appropriate direction during ablation by vertical laser 701 in order to ablate adhesive 202 across the entire surface of hander 201. FIG. 8 illustrates a cross section of an embodiment of a system for laser ablation in which hander 201, adhesive 202, and wafer 203 are supported at an angle on a rotary stage 802 during ablation by angled laser 801. Rotary stage 802 may move as needed in any appropriate direction during ablation by angled laser 801 in order to ablate adhesive 202 across the entire surface of handler 201. FIGS. 5-8 are shown for illustrative purposes only; the laser may be at any appropriate angle to handler 201, and the hander 201, adhesive 202, and wafer 203 may be in any appropriate configuration with respect to the laser.

Figure 9:
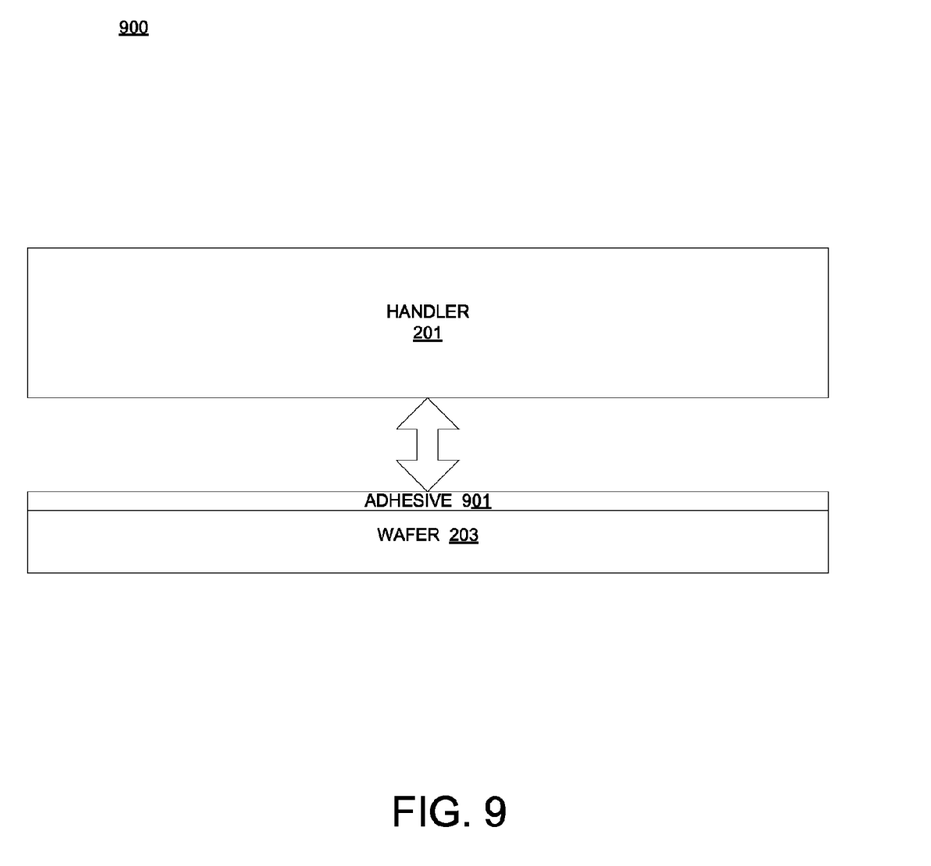
FIG. 9 illustrates an embodiment of the device of FIG. 2 after laser ablation and release of the handler from the wafer.

In block 103, the handler 201 is released from wafer 203, as shown in FIG. 9. Block 103 may include a wet soak of wafer 203 to remove any ablated adhesive 901 that may remain on wafer 203 after release of handler 201. Block 103 may be performed at room temperature in some embodiments, or in other embodiments, the structure 200 may be heated up to 400° C. during release to promote release of handler 201 from wafer 203.

The technical effects and benefits of exemplary embodiments include attachment and release of a handler to an IC wafer without damage to the IC wafer and with good throughput.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for releasing a handler from a wafer, the wafer comprising an integrated circuit (IC), the method comprising:

attaching the handler to the wafer using an adhesive comprising a thermoset polymer, the handler comprising one of quartz, diamond, and sapphire, and wherein the handler is transparent in a wavelength range of about 193 nanometers (nm) to about 400, and wherein attaching the handler to the wafer further comprises forming a layer of optical energy absorbing material that is located between the adhesive and the handler, the optical energy absorbing material comprising one or more layers of sputtered metal;

ablating the adhesive through the handler using a laser, wherein a wavelength of the laser is selected based on the transparency of the handler material; and separating the handler from the wafer.

2. The method of claim 1, wherein the adhesive comprises a polyimide-based polymer configured to withstand processing at a temperature of over about 350° C.

3. The method of claim 1, wherein the handler material comprises diamond.

4. The method of claim 1, wherein the handler material comprises quartz, and the wavelength of the laser is about 193 nm.

5. The method of claim 1, wherein the handler comprises sapphire.

6. The method of claim 1, further comprising performing edge processing prior to ablating the adhesive, wherein edge processing comprises:

applying a focused ion beam to the edge to remove the adhesive located at the edge.

7. The method of claim 1, wherein the laser comprises one of a flood exposure of a top surface of the handler and a focused beam having one of a line or square shape, wherein the focused beam laser is pulsed across a top surface of the handler.

8. The method of claim 1, further comprising heating the wafer and handler to a temperature of about 400° C. during ablating of the adhesive and separating the handler from the wafer.

9. The method of claim 1, wherein ablating of the adhesive and separating the handler from the wafer is performed at room temperature.

10. The method of claim 1, wherein the laser is at an angle to the handler.

11. The method of claim 1, wherein the laser is perpendicular to the handler.

12. The method of claim 1, wherein the wafer is located on a rotary stage, the rotary stage being configured to move during ablation of the adhesive.

13. The method of claim 1, further comprising performing edge processing prior to ablating the adhesive, wherein edge processing comprises:

applying a high-energy electron beam to the edge to remove the adhesive located at the edge.

14. The method of claim 1, further comprising performing edge processing prior to ablating the adhesive, wherein edge processing comprises:

applying a chemical to an edge of the wafer and handler to disintegrate the adhesive located at the edge.

15. The method of claim 1, further comprising performing edge processing prior to ablating the adhesive, wherein edge processing comprises:

exposing the edge to a vacuum or atmospheric pressure plasma environment configured to disintegrate the adhesive located at the edge.

16. The method of claim 1, further comprising performing edge processing prior to ablating the adhesive, wherein edge processing comprises:

exposing the device to a super-critical solvent environment containing chemicals selected to degrade the adhesive at the edge.

17. A system for releasing a handler from a wafer, the wafer comprising an integrated circuit (IC), the system comprising:

a handler attached to a wafer using an adhesive comprising a thermoset polymer, the handler comprising one of quartz, diamond, and sapphire, and wherein the handler transparent in a wavelength range of about 193 nanometers (nm) to about 400 nm, and further comprising a layer of optical energy absorbing material located between the adhesive and the handler, the optical energy absorbing material comprising one or more layers of sputtered metal; and a laser, the laser configured to ablate the adhesive through the handler, wherein a wavelength of the laser is selected based on the transparency of the handler material.

18. The system of claim 17, wherein the wafer comprises one of a silicon-based 3D or 4D chip, a thin film solar cell, a silicon solar cell, and a glass substrate-based solar cell.

19. The system of claim 17, wherein the adhesive comprises a polyimide-based polymer configured to withstand processing at a temperature of over about 280° C.

\* \* \* \* \*